United States Patent [19]

Sugimura et al.

[11] Patent Number: 4,728,135
[45] Date of Patent: Mar. 1, 1988

[54] COMPONENT SUCKING AND HOLDING MACHINE

[75] Inventors: Toshiaki Sugimura, Osaka; Yoshihiko Misawa, Katano; Makito Seno, Hirakata, all of Japan

[73] Assignee: Matsushita Electric Industrial Co., Ltd., Kadoma, Japan

[21] Appl. No.: 9,593

[22] Filed: Jan. 29, 1987

Related U.S. Application Data

[63] Continuation of Ser. No. 682,844, Dec. 18, 1984, abandoned.

[30] Foreign Application Priority Data

Dec. 20, 1983 [JP] Japan ................... 58-240228

[51] Int. Cl.4 .......................................... B25J 15/06
[52] U.S. Cl. ..................... 294/64.1; 29/743
[58] Field of Search ............ 294/64.1, 65; 29/740, 29/743; 269/21; 271/90, 91, 103; 248/362, 363; 279/3; 414/72, 121, 627, 737, 744 B, 752

[56] References Cited

U.S. PATENT DOCUMENTS

| | | | |
|---|---|---|---|
| 1,934,855 | 11/1933 | Humphrey | 294/64.1 |
| 2,745,665 | 5/1956 | Labombarde | 294/64.1 X |
| 2,789,680 | 4/1957 | Kerr | 414/744 B X |
| 3,000,628 | 9/1961 | Spiess | 271/103 |
| 3,167,326 | 1/1965 | Heessels | 279/3 |
| 3,510,126 | 5/1970 | Romanens | 271/103 X |
| 3,841,687 | 10/1974 | Banyas et al. | 294/64.1 |

FOREIGN PATENT DOCUMENTS

| | | | |
|---|---|---|---|
| 3102206 | 8/1982 | Fed. Rep. of Germany | 29/743 |
| 1193921 | 6/1970 | United Kingdom | 294/64.1 |

OTHER PUBLICATIONS

IBM Technical Disclosure Bulletin, "Vacuum Foot Separator" by T. Barna, vol. 7, No. 2, Jul. 1964.

*Primary Examiner*—Johnny D. Cherry
*Attorney, Agent, or Firm*—Cushman, Darby & Cushman

[57] ABSTRACT

The component sucking and holding machine concentrically comprises a first sucking pipe having a wider-area-sucking-opening at its end tip and a second sucking pipe inserted in the first sucking pipe, having a narrower-area-sucking opening at its end tip; the machine can easily suck and hold a component having various sizes by changing the relative position between the first and second sucking pipes.

15 Claims, 13 Drawing Figures

COMPONENT SUCKING AND HOLDING MACHINE

This is a continuation of application Ser. No. 682,844, filed Dec. 18, 1984, which was abandoned upon the filing hereof.

BACKGROUND OF THE INVENTION

1. FIELD OF THE INVENTION

The present invention relates to a component sucking and holding machine for holding small electronic components such as flat type IC by utilizing a vacuum sucking method, in order to transfer or attach and so on the components to necessary place.

2. DESCRIPTION OF THE PRIOR ART

Recently, an electronic component having extremely short lead wire or no lead wire (hereinafter is referred to abbreviate as a leadless component), for example, a flat type IC or chip type resistors, is used responding to a miniaturization of an apparatus. Responding to kinds of the lead-less component, various kinds of component sucking and holding machines for transferring or attaching the leadless component to a printed circuit board and so on have been known.

Figure 1:
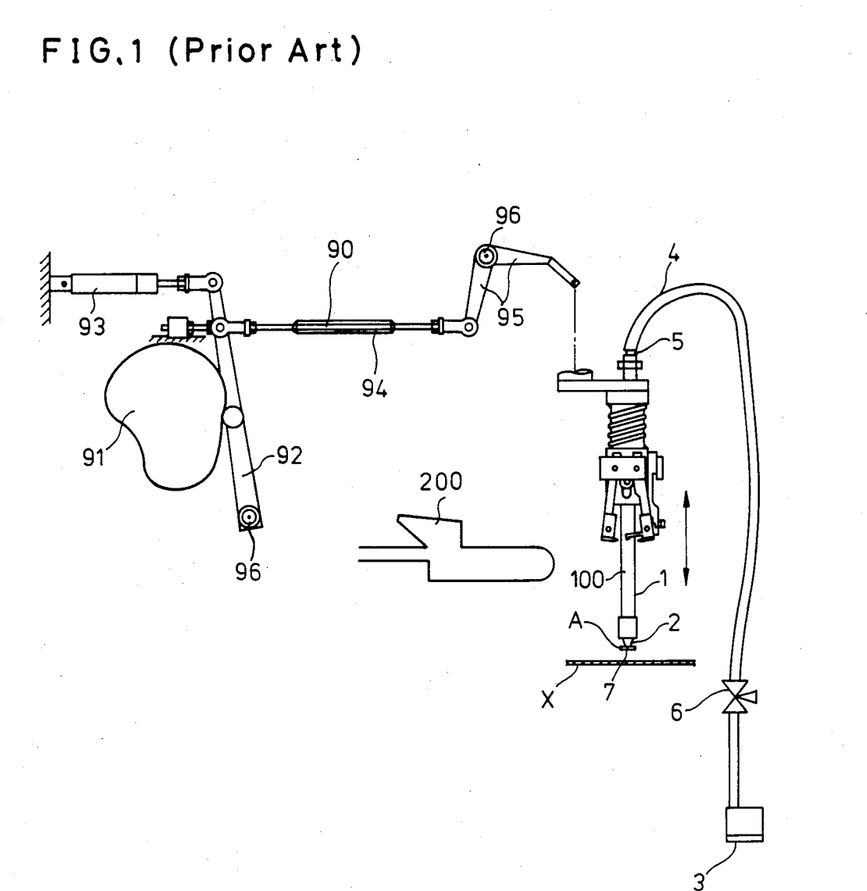
FIG. 1 is a schematic front view showing a conventional component sucking and holding machine.
Figure 2:
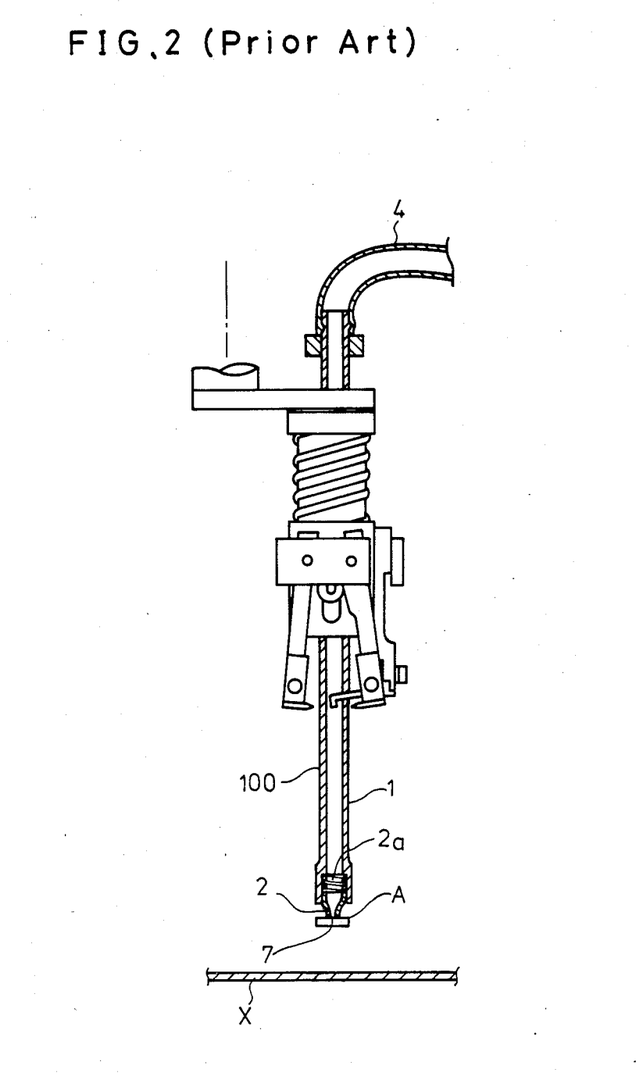
FIG. 2 is a partial sectional view of a sucking head part of the conventional component sucking and holding machine.

FIG. 1 shows a schematic view of one of the conventional component sucking and holding machines FIG. 2 shows a sectional view of a sucking head part of the conventional component sucking and holding is detachably attached. A spring 2a is provided as a shock absorbing means. The vacuum pump 3 is connected to the upper end of the sucking pipe body 100 through a connecting tube 4 and a coupling member 5. A valve 6 is for switching air channel from the vacuum pump 3 to an outside air and vice versa. The sucking head part 100 is transferred to any position by a head driving means 90. The head driving means 90 comprises a cam 91, an arm 92 which is enforced always to the cam 91 by an air cylinder 93, a shaft 94, a lever 95 which is connected to the arm 92 through the shaft 94 and supporting fulcrum axes 96, 96.

The operation of the conventional component sucking and holding machine is as follows.

The head driving means 90 transfers the sucking head part 100 to a component supplying table 200. The vacuum pump 3 operates by opening the valve 6, thereby to suck air in the connection tube 4 and the sucking pipe body 1. After this operation, the top end 7 of the sucking nozzle 2 is touched on a suction surface of a component A on the component supplying table 200 by the head driving means 90. Thus the component A sticks to the end tip 7 of the sucking nozzle 2. Then, the sucking head part 100 is transferred to a printed circuit board X by the head driving means 90.

In such a conventional component sucking and holding machine, the area of the top end 7 of the sucking nozzle 2 is non-variable. Therefore, when components having various suction surface areas are to be sucked and held, it is necessary to exchange the sucking nozzle 2 or the sucking pipe body 1 responding to the various sizes of the components. Therefore, the conventional component sucking and holding machine requires much labor and time. In case the component sucking machine is designed such that the sucking nozzle 2 or the sucking pipe body 1 can not be exchanged, it is necessary to provide several kinds of the component sucking and holding machines to work various types and sizes of works. Therefore, the production system for sucking and holding various components becomes expensive, and is not suitable for a flexible system.

SUMMARY OF THE INVENTION

The present invention is intended to provide a component sucking and holding machine capable of varying a suction area of a lowest end tip of a sucking head part responding to various kinds of sizes of the components, thereby to save labor or make the sucking and holding system inexpensive.

The component sucking and holding machine of the present invention comprises:

a first sucking pipe having a sucking opening of wider-area at its end tip, for sucking and holding a component which has a larger suction surface, a second sucking pipe having a sucking opening of narrower-area at its end tip, for sucking and holding a component which has a smaller suction surface, the second sucking pipe being inserted in the first sucking pipe in a coaxial relation, vacuuming means for sucking air at least in the second sucking pipe, and driving means for transferring the first sucking pipe and the second sucking pipe.

DESCRIPTION OF THE PREFERRED EMBODIMENT

Figure 3:
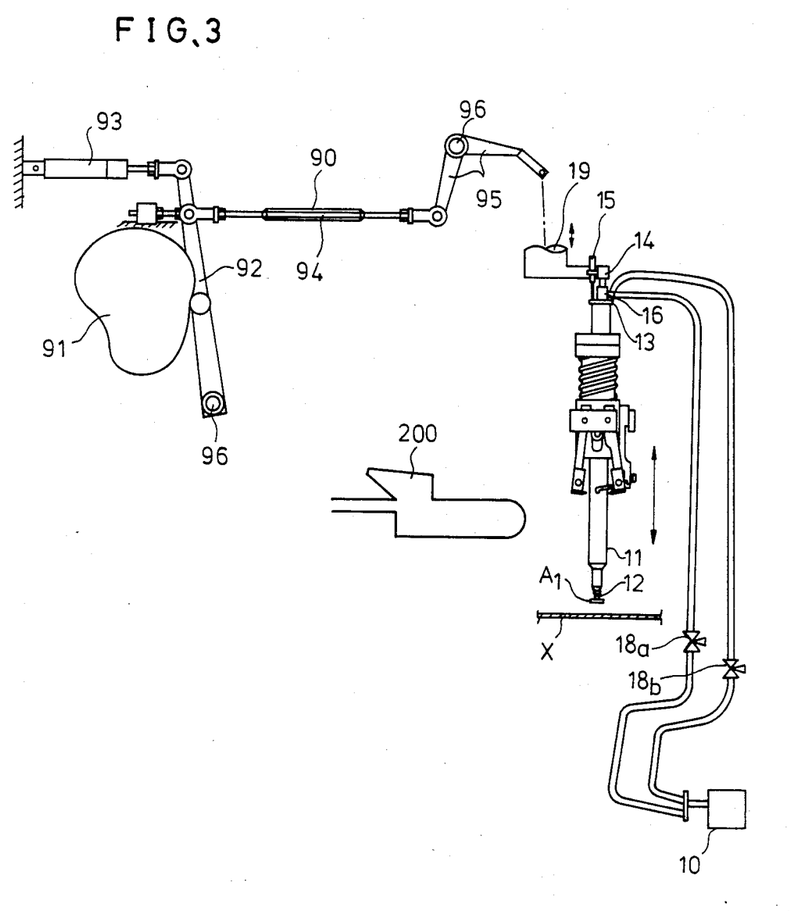
FIG. 3 is a schematic front view showing a first embodiment of the component sucking and holding machine of the present invention.
Figure 4:
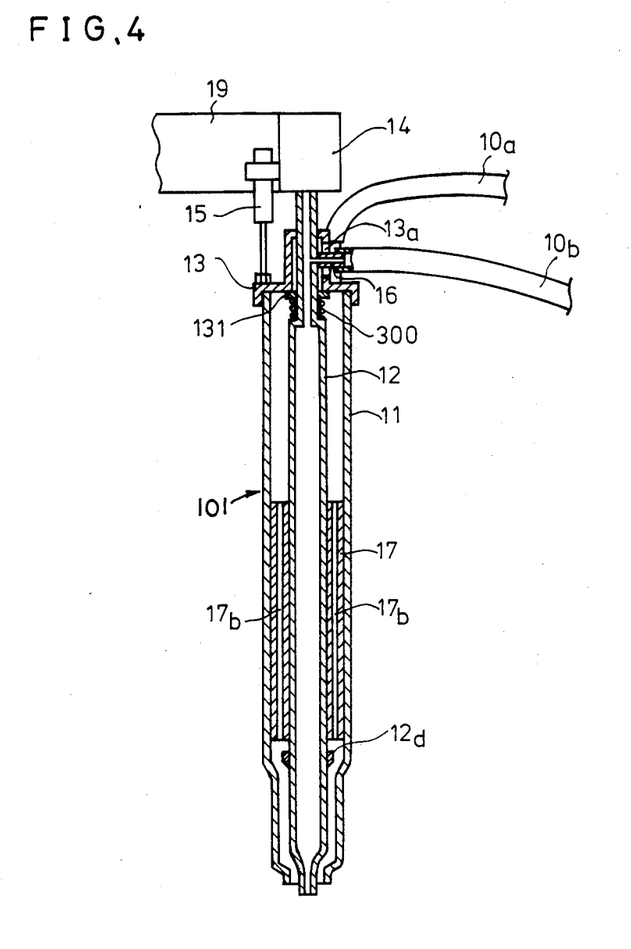
FIG. 4 is a partial sectional view of a sucking head part of the component sucking and holding machine of a first embodiment of the present invention.

FIG. 3 shows a first embodiment of the component sucking and holding machine of the present invention, and FIG. 4 shows the sucking head part 101 of the first embodiment of the component sucking and holding machine. In FIGS. 3 and 4, the parts corresponding to those of FIGS. 1 and 2 are designated by the same numbers as in FIGS. 1 and 2. The sucking head part 101 comprises a first or outer sucking pipe 11, a bowler hat type first cap means 13 covering the top edge of the first sucking pipe 11. The sucking head part 101 further has a second or inner sucking pipe 12 which is inserted in the first sucking pipe 11 on a same axis, the top edge of which is projected outside through the first cap means 13, and a second cap means 14 covering the top edge of the second sucking pipe 12. Between the first and second sucking pipes 11 and 12 are provided a cylindrical spacer 17, which has several longitudinal through holes 17b, 17b, ... and is fixed to the inner surface of the first sucking pipe 11, thereby to form a space for sucking air. The first sucking pipe 11 is slidable on the second sucking pipe 12. The spacer 17 is for making the sliding of the first sucking pipe 11 smooth and preventing the relative rotation around axis of the second sucking pipe 12 against the first sucking pipe 11. One end of a first tube 10a is connected to the first cap means 13 and the other end of the first tube 10a is connected to a vacuum pump 10 through a valve 18a. Therefore, the vacuum pump 10 can suck the air in the first tube 10a and the air in the first sucking tube 11. At the side part of the first cap means 13, a slit type hole 13a is formed, which is long in an axial direction of the first sucking pipe 11. Through the hole 13a, a coupling means 16 is connected to the top part of the second sucking pipe 12. One end of a second tube 10b is connected to the coupling means 16 and the other end of the second tube 10b is connected to the vacuum pump 10 through a valve 18b. Therefore, the vacuum pump 10 can suck the air in the second tube 10b and the air in the second sucking tube 12. The valves 18a and 18b are solenoid valves for switching air path from the vacuum pump 10 to the outside air and vice versa.

The second cap means 14 is fixed to an arm 19. The head driving means 90 can transfer the arm 19 to any position.

An air cylinder 15 is fixed to the second cap means 14 and the rod end of the air cylinder 15 is connected to the first cap means 13. Therefore, the air cylinder 15 can transfer the first sucking pipe 11 longitudinally against the second sucking pipe 12. Since the hole 13a of the first cap means 13 is of an oval shape which is oblong in the longitudinal direction, the longitudinal transferring of the first cap means 13 is permitted even with engagement with the coupling means 16.

Incidentally, a ring like packing 131 is fixed to the lower surface of the first cap means 13 and touches the upper side part of the second sucking pipe 12, thereby to seal a gap between the first cap means 13 and the upper side part of the second sucking tube 12. A spring 300 is for enforcing the first sucking pipe 11 in an upper direction.

The operation of the first embodiment in FIGS. 3 and 4 is described first.

Figure 5:
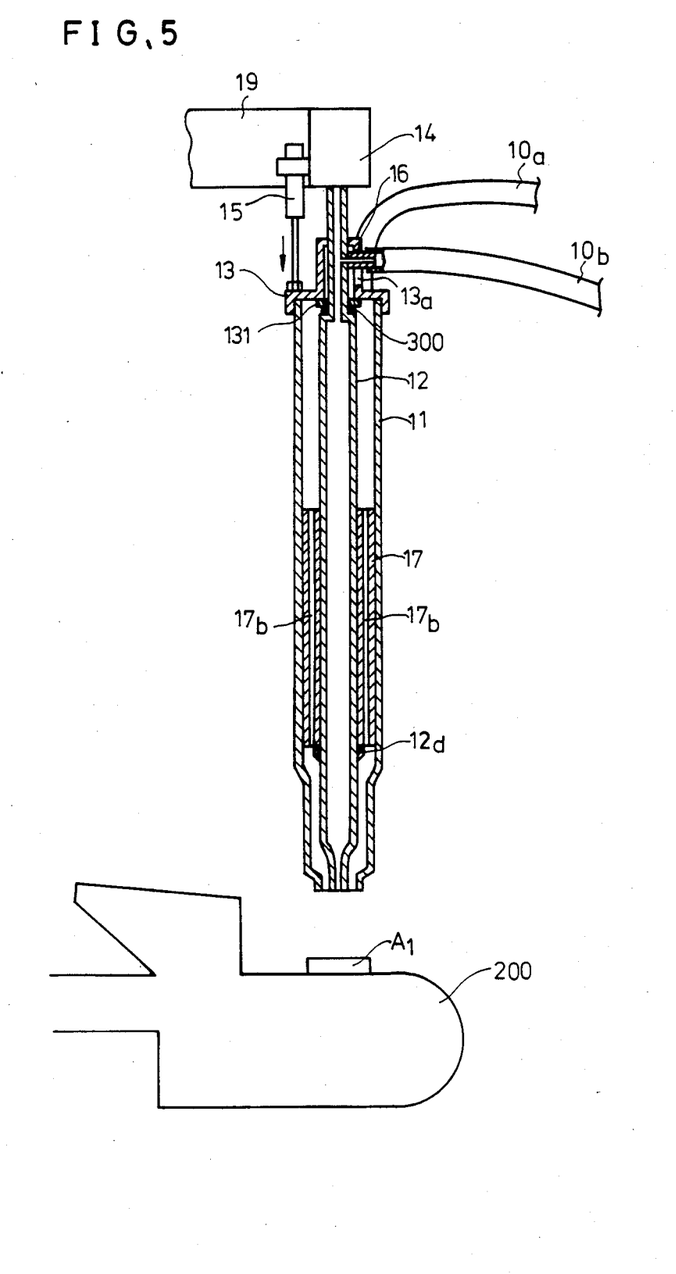
FIG. 5 is another partial sectional view of the sucking head part of the component sucking and holding machine of the first embodiment of the present invention.

When a leadless component $A_1$ which has a large suction surface such as a flat type IC is transferred, the operation of the component sucking and holding machine of the present invention is as follows. The first sucking pipe 11 and the second sucking pipe 12 are transferred to a position above the component supplying table 200. The first sucking pipe 11 is descended by the air cylinder 15 until the lowest end tip of the first sucking pipe 11 reaches a level of the lowest end tip of the second sucking pipe 12 as shown in FIG. 5. Therefore, a large sucking area is formed. Then the second sucking pipe 12 is descended with the first sucking pipe 11 by the head driving means 90 through the arm 19. When the lowest ends of the first and second sucking pipes 11, 12 come near the component $A_1$, the valves 18a and 18b are exchanged to the vacuum pump 10 and the air in the first sucking pipe 11 and the second sucking pipe 12 is sucked by the vacuum pump 10. When the lowest end tips of the first and second sucking pipes 11 and 12 touch the upper surface of the component $A_1$, the component $A_1$ is sucked and held by the lowest end tip of the first and second sucking pipes 11 and 12, sucking a wide sucking area. A stopper 12d is for the spacer 17. Then the first and second sucking pipes 11 and 12 are lifted with the component $A_1$ by right hand motion of the head driving means 90 through the arm 19, and transferred to a position above a printed circuit board X. Then the first and second sucking pipes 11 and 12 are put down as shown in FIG. 3. When the component $A_1$ touches the predetermined part of the printed circuit board X, the valves 18a and 18b are switched to the outside air and the sucking and holding is dissolved, thereby to put the component $A_1$ on the predetermined part of the printed circuit board X.

It is noted, however, that it is the tip end of the second pipe 12 which governs the movement of the sucking head 101 to pick up or place a component irrespective of the two relative positions of the first pipe 11, i.e. the tip end of the first pipe is either substantially coplanar with that of the second pipe or located thereabove.

When a leadless component $A_2$ which has a small suction surface such as a chip type resistor is transferred, the operation of the component sucking and holding machine of the present invention is as follows.

Figure 6:
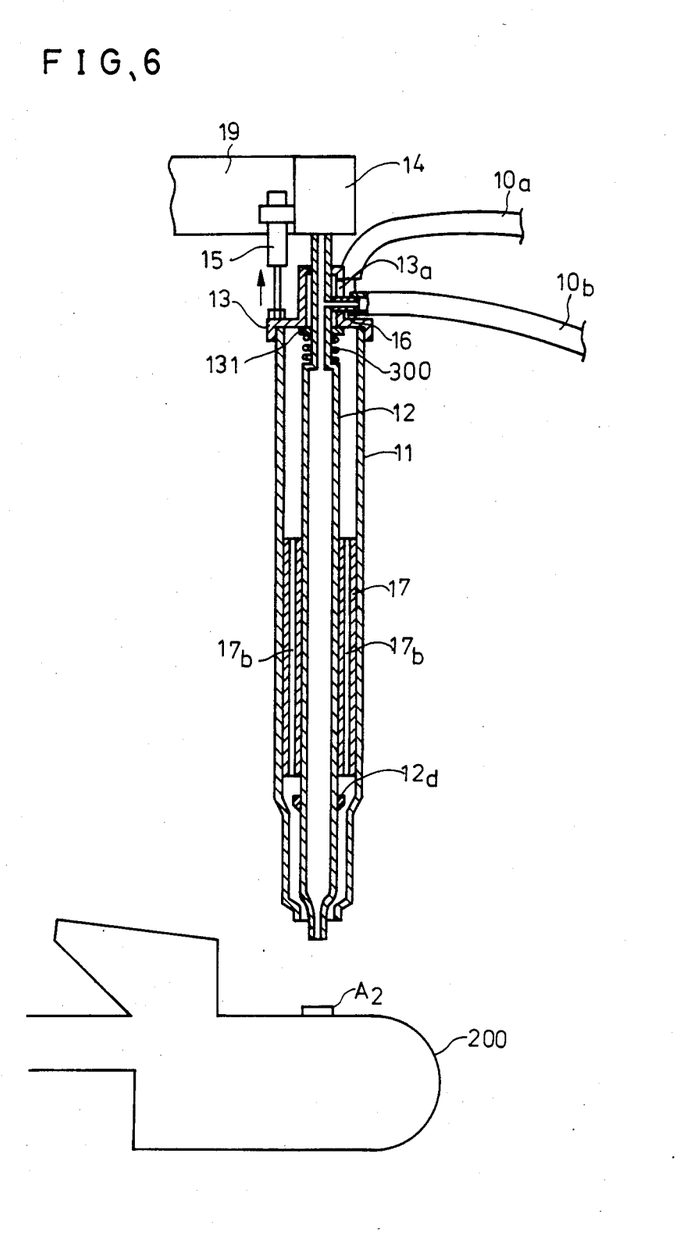
FIG. 6 is still another partial sectional view of the sucking head part of the component sucking and holding machine of the first embodiment of the present invention.

In this case, the air cylinder 15 lifts the first sucking pipe 11, thereby to make the lowest end tip of the second sucking pipe 12 project downward as shown in FIG. 6. Then the first and second sucking pipes 11, 12 are transferred to a position above the component supplying table 200. Then the first and second sucking pipes 11, 12 are put down by the head driving means 90 through the arm 19. When the lowest end tip of the second sucking pipe 12 comes near the component $A_2$, only the valve 18b is exchanged to the vacuum pump 10. Therefore, the air in the second sucking pipe 12 is sucked by the vacuum pump 10. When the lowest end tip of the second sucking pipe 12 touches the upper surface of the component $A_2$, the component $A_2$ is sucked and held by the lowest end tip of the second sucking pipe 12, having a narrow sucking area. Then the sucked and held component $A_2$ is transferred to the predetermined part of the printed circuit board X like as the case of the large size component $A_1$. Then the valve 18b is switched to the outside air, thereby to put the component $A_2$ on the predetermined part of the printed circuit board X.

Incidentally, the head driving means 90 or other means (not shown in figure), which has a pulse motor, a gear connected to the second cap means 14 and so on, can rotate the first and second sucking pipes 11 and 12 around their axes in order to amend the direction of the sucked and held component $A_1$ or $A_2$.

Thus, the component sucking and holding machine of the present invention can vary the suction area of the sucking head part 101 by driving the first and second sucking pipes 11 and 12 selectively, thereby to respond the various sizes of the components easily, simply and inexpensively.

Further, since this invention adopts such configuration that the outer first sucking pipe 11 is transferred against the inner second sucking pipe 12 for varying the sucking and holding area to respond to change of size of the work to be sucked and the inner second sucking pipe 12 is driven for large scale notion by the head driving means 90, it is not necessary to transfer the second sucking pipe 12 in complicated program. That is, the control for transferring the second sucking pipe 12 can be the same irrespective of selection of modes for a larger component or smaller component. On the contrary, if the outer first sucking pipe 11 is driven largely by the head driving means 90, then the motion of the head driving means 90 must be changed for difference of the size of the component.

Incidentally, when the configuration is such that the levels of the lowest end tips of the first and second sucking pipes 11 and 12 are maintained on a same plane, the sucking and holding of the component can be executed by the suction of air in the first sucking pipe 11 and in the second sucking pipe 12 for larger component, or by the air only in the second sucking pipe 12 for smaller component.

A second embodiment of the component sucking and holding machine of the present invention is as follows.

Figure 7:
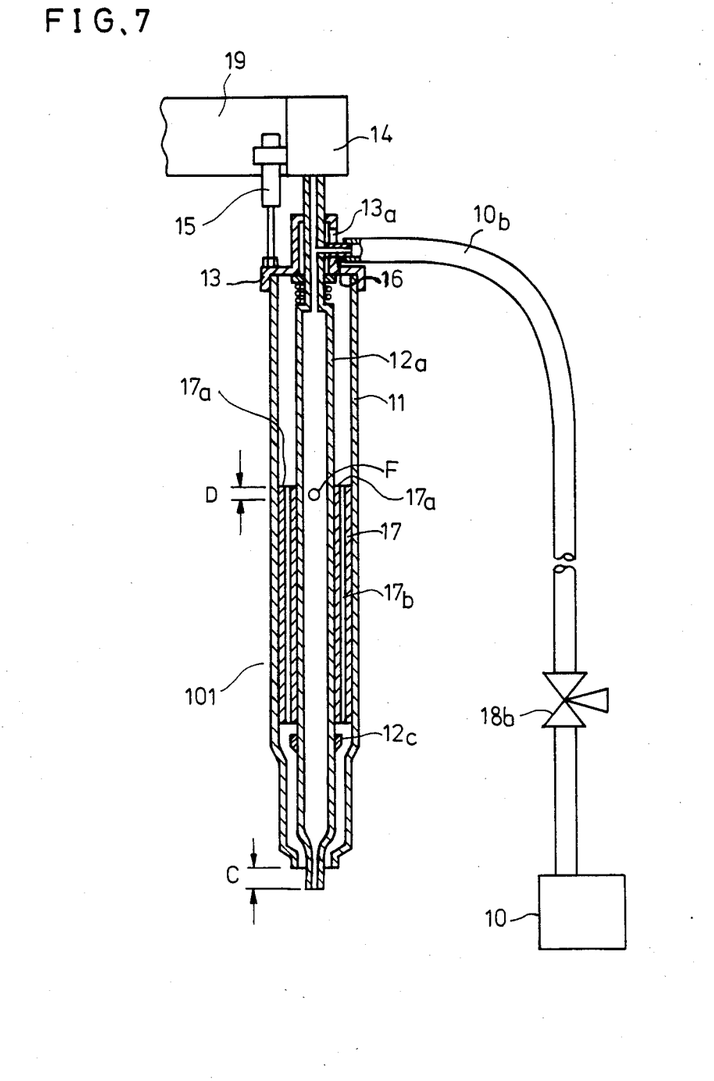
FIG. 7 is a partial sectional view of a sucking head part of a component sucking and holding machine of a second embodiment of the present invention.

FIG. 7 shows a sectional view of the sucking head part 101 of the second embodiment of the present invention.

In FIG. 7, the parts corresponding to those of FIG. 4 are designated by the same members as in FIG. 4.

The first cap means 13 does not have a corresponding member to the first tube 10a of the first embodiment.

The second sucking pipe 12a has at least one hole F at its side part. The position of the hole F is determined as below.

The amount of the transferring of the first sucking pipe 11 by the air cylinder 15 is indicated by C in FIG. 7. The maximum distance between the upper end 17a of the spacer 17 which is connected to the first sucking pipe 11, and the hole F is indicated by D in FIG. 7. The relation of the transferring amount C and the maximum distance D should be C>D.

Under such condition, when the first sucking pipe 11 is lifted up as shown in FIG. 7 by the air cylinder 15, the hole F is covered by the spacer 17.

In this case, the vacuum pump 10 sucks only the air in the second sucking pipe 12a; therefore, the lowest end tip having narrow sucking area of the second sucking pipe 12a operates only for a small size component $A_2$.

When the first sucking pipe 11 is put down until the lowest end tip of the first sucking pipe 11 reaches the level of the lowest end tip of the second sucking pipe 12a, the hole F becomes open since the hole F is not covered by the spacer 17. In this case, the vacuum pump 10 sucks the air in the second sucking pipe 12a and therefore, the air in the first sucking pipe 11 is sucked through the hole F. Thus, the lowest end tips of the first and second sucking pipes 11 and 12a make a wide sucking area for a large size component A.

Therefore, in the second embodiment in FIG. 7, only one connecting tube 10b and one valve 18b suffice, and therefore the construction of the component sucking and holding machine of the second embodiment is simple and operates certainly.

A third embodiment of the component sucking and holding machine of the present invention is as follows.

Figure 8:
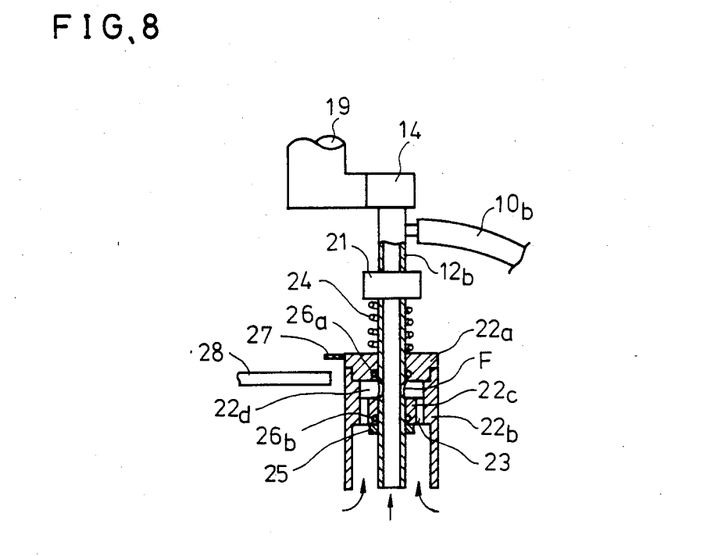
FIG. 8 is a partial sectional view of a sucking head part of a component sucking and holding machine of a third embodiment of the present invention.
Figure 9:
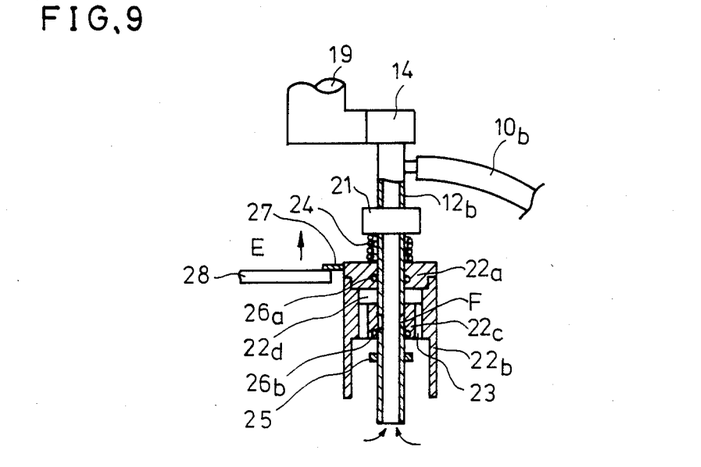
FIG. 9 is another partial sectional view of the sucking head part of the component sucking and holding machine of a third embodiment of the present invention.

FIGS. 8 and 9 show the sectional views of the sucking head part 101 of the third embodiment.

In FIGS. 8 and 9, the parts corresponding to those of FIG. 7 are designated by the same numbers as in FIG. 7.

The second suking pipe 12b has a hole F as like in FIG. 7. The second sucking pipe 12b has a stopper block 21 at the upper part. The first sucking pipe 22b is covered by a cover block 22a with, for example, screw construction. Between the cover block 22a and the stopper block 21, a spring 24 is attached for enforcing the cover block 22a downward. The first sucking pipe 22b has a ring type projection 22c which is projected in an inner direction. The most inner surface of the projection 22c touches the second sucking pipe 12b and the projection 22c has at least one longitudinal through hole 23. Under the projection 22c, a stopper 25 is fixed to the second sucking pipe 12b. The relation among the positions of the hole F, the projection 22c and the stopper 25 is that the hole F is exposed in a space 22d formed by the cover block 22a, the upper part of the second sucking pipe 22b and the projection 22c, when the projection 22c is supported by the stopper 25 and the projection 22c covers the hole F when the first sucking pipe 22b is lifted up as shown in FIG. 9.

At the former state, the lowest end tip of the first sucking pipe 22b and the second sucking pipe 12b are at the same plane as shown in FIG. 8.

At the latter state, the lowest end tip of the second sucking pipe 12b is projected downward as shown in FIG. 9.

The cover block 22a has a pin 27 at its peripheral part which can be lifted up by a lever 28.

Therefore, when the first sucking pipe 22b is not lifted by the lever 28 as shown in FIG. 8, that is, the first sucking pipe 22 is disposed at low position by the force of the spring 24 and the projection 22c is supported by the stopper 25, the hole F is open. Therefore in this state the air in the second sucking pipe 12b is sucked and at the same time the air in the first sucking pipe 22b is also sucked through the hole F and the through hole 23 by the vacuum pump 10 as shown in FIG. 8. Therefore, the lowest end tip of the first and second sucking pipes 22b and 12b form a wide suction area.

When the first sucking pipe 22b is lifted by the lever 28 as shown in FIG. 9, that is, the first sucking pipe 22b is disposed at high position against the force of the spring 24 and the projection 22c transfers upward, the hole F is covered by the projection 22c. Therefore the air only in the second sucking pipe 12b is sucked by the vacuum pump 10. Accordingly, the lowest end tip of the second sucking pipe 12b forms a narrow sucking area An O-ring 26a operates for sealing the gap between the cover block 22a and the second sucking pipe 12b, and an O-ring 26b operates for sealing the gap between the projection 22c and the second sucking pipe 12b.

Therefore, the component sucking and holding machine of the third embodiment has simple construction and light weight.

Figure 10:
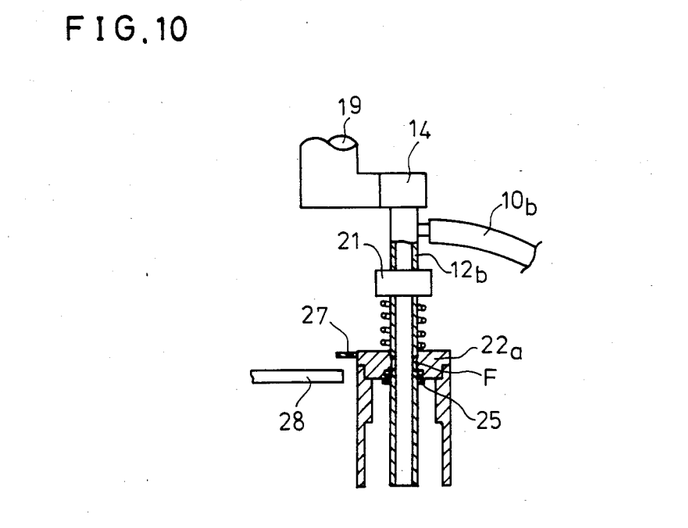
FIG. 10 is a partial sectional view of a sucking head part of a component sucking and holding machine of a fourth embodiment of the present invention.
Figure 11:
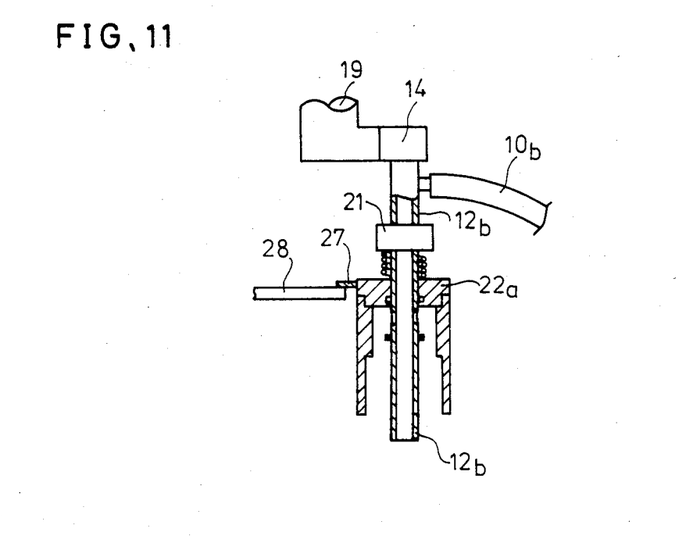
FIG. 11 is another sectional view of the sucking head part of the component sucking and holding machine of the fourth embodiment of the present invention.

Further, FIGS. 10 and 11 show a fourth embodiment of the component sucking and holding machine of the present invention In FIGS. 10 and 11, the parts corresponding to those of FIGS. 8 and 9 are designated by the same numbers.

In this fourth embodiment, when the cover block 22a is disposed at a lower position as in FIG. 10 by means of a spring 24, the hole F is opened by the cover block 22a. Therefore, only the air in the second sucking pipe 12b is sucked by the vacuum pump 10. A stopper 25 supports the cover block 22a. When the cover block 22a is lifted up by the lever 28, the hole F becomes open as shown in FIG. 11; therefore the air in the second sucking pipe 12b is sucked and the air in the first sucking pipe 22b is also sucked through the hole F by the vacuum pump 10.

Figure 12A:
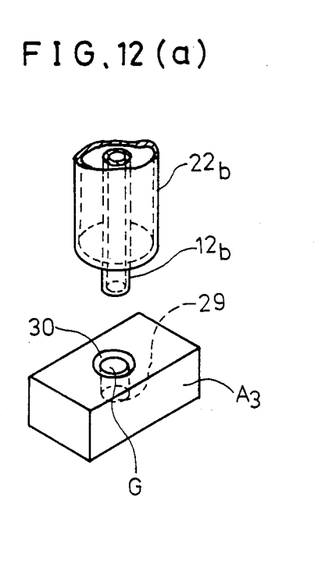
FIG. 12(a) is a perspective view of the sucking head part of the component sucking and holding machine of the fourth embodiment and a component.
Figure 12B:
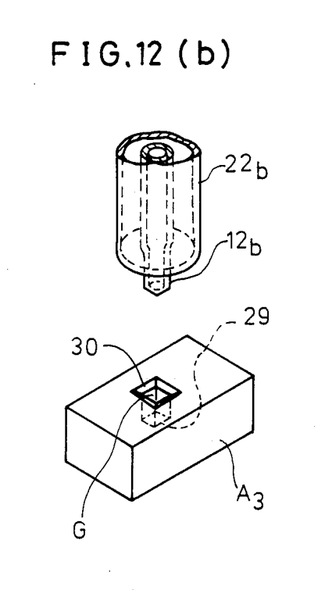
FIG. 12(b) is a perspective view of another embodiment of sucking head part of the component sucking and holding machine of the fourth embodiment and a component.

Such component sucking and holding machine of the fourth embodiment can be used, for example, for a component A3 having a hole G as in FIGS. 12(a) and 12(b).

That is, the projected lowest end tip of the second sucking pipe 12b at the state described in FIG. 11 is inserted to the hole G. Thus the positioning of the component A3 against the printed circuit board X can be executed precisely. The lowest end tips of the second sucking pipe 12b and the first sucking pipe 22 touch the surface of the component A3 and the bottom face 29 of the hole G respectively, thereby enabling them to suck and hold the component A3 firmly.

The hole G of the component A3 in FIG. 12(a) is of cylindrical shape and the shape of the lowest end tip of the second sucking pipe 12b in FIG. 12(a) is also cylindrical corresponding to the shape of the above hole G.

The hole G of the component A3 in FIG. 12(b) is of square pillar shape and the shape of the lowest end tip of the second sucking pipe 12b in FIG. 12(b) is of square pillar shape corresponding to the shape of the above hole G. The taper surface 30 is for smoothly guiding the lowest end tip of the second sucking pipe 12b into the hole G.

Incidentally, the means for lifting up the first sucking pipe 22b in the third and fourth embodiments is not necessarily restricted to the above-mentioned lever 28 and pin 27, but can be any other means such as that utilizing a cam system.

What is claimed is:

1. A component sucking and holding machine comprising:
    a first sucking pipe having a first sucking opening at one end thereof for sucking and holding a component wich has a suction surface area larger than the area of said first opening;
    a second sucking pipe disposed coaxially within said first pipe and having a second sucking opening at one end thereof for sucking and holding a component which has a suction surface area larger than the area of said second opening, the area of said first opening being larger than that of said second opening;
    first means for moving said first pipe axially relative to said second pipe between a first position where said one ends are at least substantially coplanar and a second position where said one end of said second pipe projects out of said first opening; and
    vacuum pump means for selective sucking of the air in said first sucking pipe and the air in said second sucking pipe.

2. The machine defined in claim 1 including means for moving the pipes as a unit to transfer a component held thereby from one place to another.

3. The machine defined in claim 2 wherein the means for moving the pipes as a unit is fastened to the second pipe.

4. The machine defined in claim 2 wherein the means for moving the first pipe axially relative to the second pipe includes motor means connecting said pipes.

5. The machine defined in claim 2 wherein the means for moving the first pipe axially relative to the second pipe includes a lever engageable with said first pipe.

6. The machine defined in claim 1 wherein when said one end of said second pipe projects out of said first opening only said second opening is effective to suck and hold a component.

7. A component sucking and holding machine in accordance with claim 1 wherein the vacuum pump means selectively sucks the air in both said first and second sucking pipes and the air in only said second sucking pipe.

8. A component sucking and holding machine comprising:
    a first sucking pipe having a first sucking opening at one end thereof for sucking and holding a component which has a suction surface area larger than the area of said first opening;
    a second sucking pipe disposed coaxially within said first pipe and having a second sucking opening at one end thereof for sucking and holding a component which has a suction surface area larger than the area of said second opening, the area of said first opening being larger than that of said second opening;
    first means for moving said first pipe axially relative to said second pipe between a first position where said one ends are at least substantially coplanar and a second position where said one end of said second pipe projects out of said first opening;
    vacuum pump means connected to said second pipe; and
    valve means connecting the interior of said second pipe with that of said first pipe, said valve means being open when said one ends are at least substantially coplanar for sucking both said first and second pipes and closed when said one end of said second pipe projects out of said first opening for sucking only said second pipe.

9. A component sucking and holding machine comprising:
    a first sucking pipe having a first sucking opening at one end thereof for sucking and holding a component which has a suction area larger than the area of said first opening;
    a second sucking pipe disposed coaxially within said first pipe and having a second sucking opening at one end thereof for sucking and holding a component which has a suction surface area larger than the area of said second opening, the area of said first opening being larger than that of said second opening;
    first means connected to said second pipe for moving both said first and second sucking pipes between a component supplying table and a board on which the component is to be placed;
    second means for moving said first pipe axially relative to said second pipe between a first position where said one ends are at least substantially coplanar an a second position where said one end of said second pipe projects out of said first opening; and vacuum pump means connected to at least said second pipe for selective sucking of the air in both said pipes or in only said second pipe.

10. A component sucking and holding machine according to claim 9 including:
first valve means for opening and closing an air passage extending between the second sucking pipe and the vacuum pump means, and
second valve means for opening and closing an air passage connecting the interior of said second pipe with that of said first pipe corresponding to the position of said first pipe.

11. A component sucking and holding machine in accordance with claim 10, wherein the air passage connecting the interior of the pipe is defined by a hole in said second sucking pipe, and
the valve means comprising a part of said first pipe which slides over said hole.

12. A component sucking and holding machine in accordance with claim 9 or 10, wherein
the second means comprises motor means connecting the pipes.

13. A component sucking and holding machine in accordance with claim 9 or 10, wherein
the second means comprises a lever engagable with the first pipe.

14. A component sucking and holding machine in accordance with claim 9 or 10, wherein
when the one end of the second pipe projects out of the first opening, only the second opening is effective to suck and hold a component.

15. A component sucking and holding machine in accordance with claim 9 including
valve means for opening and closing air passages extending between each of the pipes and the vacuum pump means.

* * * * *